US009411928B2

(12) United States Patent
Karpin et al.

(10) Patent No.: US 9,411,928 B2
(45) Date of Patent: Aug. 9, 2016

(54) DISCONTINUOUS INTEGRATION USING HALF PERIODS

(71) Applicant: PARADE TECHNOLOGIES, LTD., Santa Clara, CA (US)

(72) Inventors: Oleksandr Karpin, Lviv (UA); Milton Ribeiro, Los Altos, CA (US); Volodymyr Bihday, Lviv (UA); Roman Ogirko, Lviv (UA); Andriy Maharyta, Lviv (UA); Igor Kolych, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 644 days.

(21) Appl. No.: 13/671,246

(22) Filed: Nov. 7, 2012

(65) Prior Publication Data
US 2014/0022203 A1   Jan. 23, 2014

Related U.S. Application Data

(60) Provisional application No. 61/672,698, filed on Jul. 17, 2012.

(51) Int. Cl.
*G06F 19/00*    (2011.01)
*G01R 27/26*    (2006.01)
*G01R 29/26*    (2006.01)
*G06F 3/044*    (2006.01)
*G06F 3/041*    (2006.01)

(52) U.S. Cl.
CPC ............ *G06F 19/00* (2013.01); *G01R 27/2605* (2013.01); *G01R 29/26* (2013.01); *G06F 3/044* (2013.01); *G06F 3/0416* (2013.01); *H03K 2217/960705* (2013.01)

(58) Field of Classification Search
CPC .... G01R 27/2605; G01R 29/26; G06F 19/00; G06F 3/0416; G06F 3/044; H03K 2217/960705
USPC .................................................. 345/170–175
See application file for complete search history.

(56) References Cited

U.S. PATENT DOCUMENTS

| 5,053,757 | A  | 10/1991 | Meadows |
| 5,283,559 | A  | 2/1994  | Kalendra et al. |
| 6,498,590 | B1 | 12/2002 | Dietz et al. |
| 8,004,502 | B2 | 8/2011  | Keam |
| 2003/0011633 | A1 | 1/2003 | Conley et al. |
| 2003/0111588 | A1 | 6/2003 | Chen |

(Continued)

OTHER PUBLICATIONS

Search Report for "Discontinuous Integration Using Half-Periods", Sep. 2012, 14 pages.

(Continued)

*Primary Examiner* — Quan-Zhen Wang
*Assistant Examiner* — Tony Davis
(74) *Attorney, Agent, or Firm* — Morgan, Lewis & Bockius LLP

(57) ABSTRACT

Apparatuses and methods of frequency hopping algorithms are described. One method monitors a signal on one or more electrodes of a sense network at a first operating frequency and detects noise in the signal at the first operating frequency. The method then switches to a second operating frequency, based on said detecting, for scanning the electrodes to detect a conductive object proximate to the plurality of electrodes, wherein a constant integration time is used for one half-period when scanning the electrodes at both the first and second operating frequencies.

11 Claims, 10 Drawing Sheets

(56) References Cited

U.S. PATENT DOCUMENTS

| | | |
|---|---|---|
| 2007/0074913 A1 | 4/2007 | Geaghan et al. |
| 2008/0157893 A1* | 7/2008 | Krah .................. 331/177 R |
| 2009/0189867 A1 | 7/2009 | Krah et al. |
| 2012/0013546 A1 | 1/2012 | Westhues et al. |
| 2012/0287055 A1* | 11/2012 | Cheng ..................... 345/173 |
| 2013/0021267 A1* | 1/2013 | Lin ......................... 345/173 |
| 2013/0106779 A1* | 5/2013 | Company Bosch et al. .. 345/174 |
| 2013/0221993 A1* | 8/2013 | Ksondzyk et al. ........... 324/681 |
| 2014/0015768 A1* | 1/2014 | Karpin et al. ............... 345/173 |

OTHER PUBLICATIONS

SiTime Corporation, "MEMS Timing Solutions Improve Touchscreen Devices", 2012, 4 pages.

Nuance, "Introducing T9 Trace—Faster, Easier Text Entry on Touchscreen Devices", 2008, 2 pages.

* cited by examiner

DISCONTINUOUS INTEGRATION USING HALF PERIODS

RELATED APPLICATIONS

This application claims the benefit of U.S. Provisional Application No. 61/672,698 filed on Jul. 17, 2012, the contents of which are hereby incorporated by reference.

TECHNICAL FIELD

This disclosure relates to the field of capacitance sensing systems and, in particular, to noise filtering in such systems.

BACKGROUND

Capacitance sensing systems can sense electrical signals generated on electrodes that reflect changes in capacitance. Such changes in capacitance can indicate a touch event (i.e., the proximity of an object to particular electrodes). Electrical sense signals can be degraded by the presence of noise.

Noise in capacitance sensing systems can be conceptualized as including "internal" noise and "external noise". Internal noise can be noise that can affect an entire system at the same time. Thus, internal noise can appear on all electrodes at the same time. That is, internal noise can be a "common" mode type noise with respect to the sensors (e.g., electrodes) of a system. Sources of internal noise can include, but are not limited to: sensor power supply noise (noise present on a power supply provided to the capacitance sensing circuit) and sensor power generation noise (noise arising from power generating circuits, such as charge pumps, that generate a higher magnitude voltage from a lower magnitude voltage).

In touch screen devices (i.e., devices having a display overlaid with a capacitance sensing network), a display can give rise to internal noise. This common mode type noise can be addressed by a common mode type filter that filters out noise common to all electrodes in a sense phase.

External noise, unlike internal noise, can arise from charge coupled by a sensed object (e.g., finger or stylus), and thus can be local to a touch area. Consequently, external noise is typically not common to all electrodes in a sense phase, but only to a sub-set of the electrodes proximate to a touch event. Sources of external noise can include, for example, charger noise or liquid crystal display (LCD) noise. Charger noise can arise from charger devices (e.g., battery chargers that plug into AC mains, or those that plug into automobile power supplies). Chargers operating from AC mains can often include a "flyback" transform that can create an unstable device ground with respect to "true" ground (earth ground). Consequently, if a user at earth ground touches a capacitance sense surface of a device while the device is connected to a charger, due to the varying device ground, a touch can inject charge at a touch location, creating a localized noise event. LCD noise is also external noise, but is additive common-mode noise, attributable to an LCD panel, used for example in a touch-screen display.

Other sources of external noise can arise from various other electrical fields that can couple to a human body, including but not limited to AC mains (e.g., 50/60 Hz line voltage), fluorescent lighting, brushed motors, arc welding, and cell phones or other radio frequency (RF) noise sources. Fields from these devices can be coupled to a human body, which can then be coupled to a capacitance sensing surface in a touch event. Thus, during sensing, a sense current can be generated in response to the sense event. However, at the same time, a noise current can arise, for example due to the operation of a charger. The noise current can be additive and subtractive to the sensed signal, and can give rise to erroneous sense events (i.e., touch indicated when no touch occurs) and/or erroneous non-sense events (i.e., touch not detected). While capacitance sensing systems can include common mode type filtering, such filtering typically does not address the adverse affects of external noise, as such noise is not present on all electrodes, but rather localized to electrodes proximate a sense event.

BRIEF DESCRIPTION OF THE DRAWINGS

The present disclosure is illustrated by way of example, and not by way of limitation, in the figures of the accompanying drawings.

DETAILED DESCRIPTION

Figure 1:
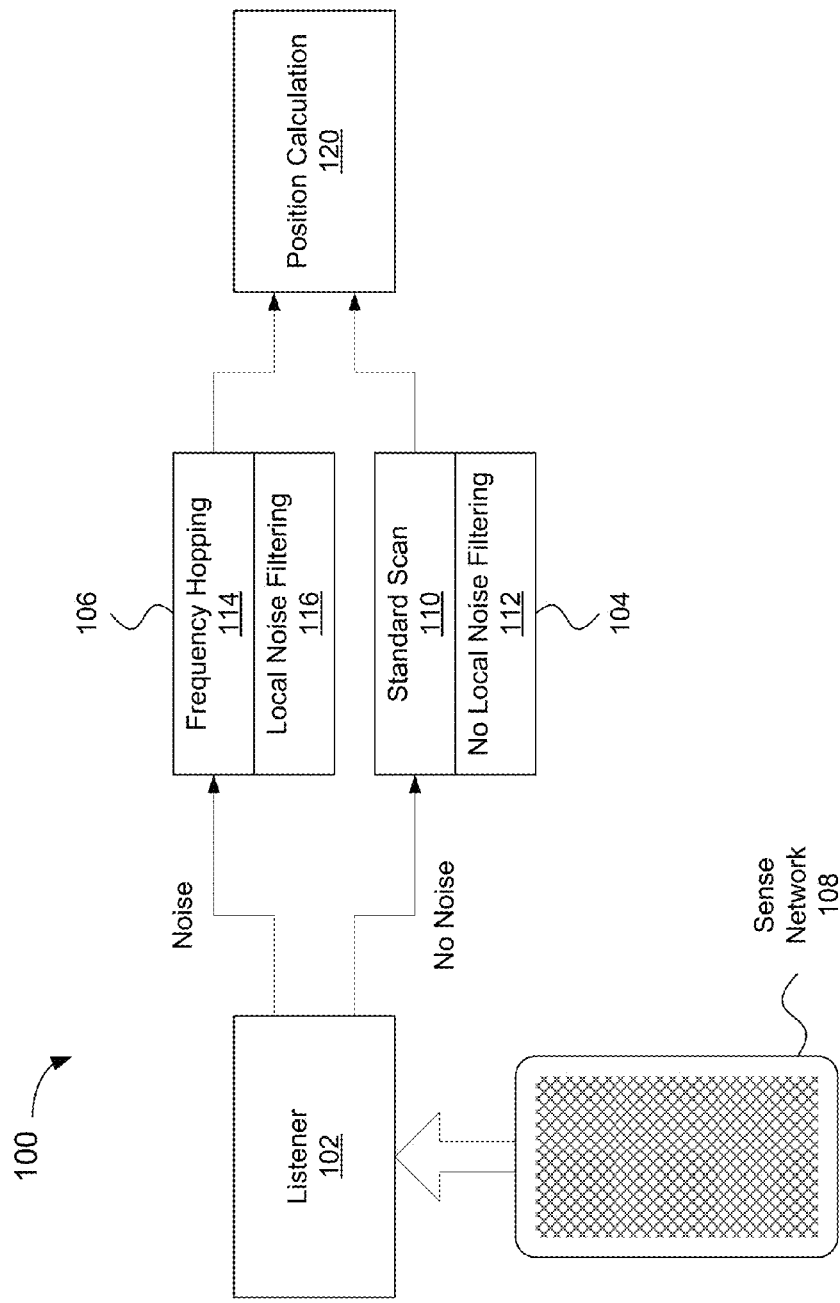
FIG. 1 is a flow diagram illustrating a capacitance sensing system operation, according to an embodiment.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described for implementing discontinuous integration using half periods in a capacitance sensing system. Capacitance sensing systems can sense electrical signals generated on electrodes that reflect changes in capacitance. Such changes in capacitance can indicate a touch event (i.e., the proximity of an object to particular electrodes). These electrical sense signals can be degraded by the presence of noise. Certain types of noise attributable to external sources (e.g., a battery charger, AC mains, radio frequency (RF) sources, LCD panel) can affect the electrical sense signals being sensed. Depending on the operating frequency of the capacitance sensing system, the impact of the noise may be increased or decreased. In general, it is desirable to have good noise immunity in order to improve the functionality of the capacitance sensing system, which may be present for example in a touchscreen or touch panel device.

In one embodiment, in order to improve the noise immunity of the system (i.e., decrease the negative impact of noise), frequency hopping techniques may be used. The idea of frequency hopping is to detect that noise, which exceeds some threshold, is present at the current operating frequency of the capacitance sensing system. If detected, the system can switch to different mode of operation having a different operating frequency which has the noise below the threshold according to a defined frequency hopping algorithm. If there is no one frequency in a list which is below the noise threshold, then the frequency hopping algorithm may pick the most quiet frequency and operate at that frequency. In conventional systems, calibration data is stored for each of the different modes of operation and different frequencies (e.g., three or more different frequencies), as well as baseline data and other information. The calibration data may include, for example, internal settings for each frequency, such as the integration time (e.g., the amount of time during with sensed current is averaged to get total charge), and IDAC data that is applied to each crossing in a capacitance sense array to compensate for parasitic mutual capacitance.

Storing this calibration data for each mode of operation (i.e., frequency) can use significant random access memory (RAM) and read-only memory (ROM) resources. In order to save memory space, certain capacitance sensing systems use a frequency hopping algorithm that hops between fewer frequencies (e.g., less than three frequencies). Using a fewer number of frequencies can lead to a decrease in noise immunity, however, as it is more likely that a noise source will adversely affect multiple of the available frequencies. This would leave fewer quiet frequencies that are not affected by the noise.

In order to avoid these problems, in one embodiment, a capacitance sensing system implements a frequency hopping algorithm that maintains a constant integration time for one half-period of each frequency used by the algorithm. Discontinuous integration (by half-period shortening) is acceptable for use in capacitance sensing systems without suffering from performance integration. The channel frequency response of discontinuous integration (by half-period shortening) does not have bifurcation of harmonics or significant differences from continuous integration. When, the integration time is kept constant for each frequency, only a single set of calibration data is used. In one embodiment, the system is calibrated once using the calibration data, and that same calibration data is used, even if the frequency is changed due to frequency hopping. Thus, discontinuous integration, using a constant integration time, for each scanning frequency eliminates the need to store calibration data for each frequency used by the frequency hopping algorithm.

In another embodiment, if significantly large noise is found at a particular frequency, additional steps may be taken. For example, the noise may be compared to a second threshold. If the noise exceeds this second threshold, which may be higher than the first, then the capacitance sensing system may decrease the integration time, while maintaining a constant frequency. This may reduce the amplitude of the noise on the main frequency harmonics. In one embodiment, reducing the integration time may be done to reduce the noise instead of hopping to a different frequency (e.g., if the capacitance sensing system does not support frequency hopping). In another embodiment, it may be done in addition to switching the frequency. In one embodiment, the integration time may be reduced to a specific value that has some special relation between the integration time and the pauses between integrations. By properly picking the pauses times, the frequency response of the capacitance sensing system can be manipulated to reduce noise at specific harmonics where noise is present, leading to an improvement in sensing performance.

FIG. 1 is a flow diagram illustrating a capacitance sensing system operation 100, according to an embodiment of the present invention. The system operation 100 can include a listening operation 102, a no local noise processing path 104, a local noise processing path 106, and a touch-position calculation operation 120. A listening operation 102 can monitor a sense network 108 for noise. A sense network 108 can include multiple electrodes for sensing a capacitance in a sensing area. In a particular embodiment, a sense network 108 can be a mutual capacitance sensing network having transmit (TX) electrodes that can be driven with a transmit signal, and receive (RX) electrodes coupled to the TX electrodes by a mutual capacitance. These electrodes may form a capacitance sensing array that is part of a touchscreen or touch panel device.

In some embodiments, the listening operation 102 can use the same electrodes used for capacitance sensing (e.g., touch-position detection) for noise detection. In one embodiment, the listening operation 102 can monitor all TX electrodes for noise. In another embodiment, the listening operation 102 can monitor all RX electrodes for noise. In yet another embodiment, the listening operation 102 can monitor both TX and RX electrodes for noise. In one embodiment, the listening operation 102 is performed at the same time, and using the same signals, as the capacitance sensing.

The listening operation 102 can compare detected noise to one or more threshold values to make a determination on the presence of noise. If noise is below a first threshold, no noise is determined to be present (i.e., "No Noise"), and a no local noise processing path 104 can be followed. In contrast, if noise is above the first threshold, noise is determined to be present (i.e., "Noise"), and a local noise processing path 106 can be followed. In addition, if noise is above a second threshold, greater than the first threshold, high noise is determined to be present (i.e., "High Noise" not shown).

In the case of a "No Noise" indication, processing can proceed according to no local noise processing path 104. Such a processing path 104 can utilize a standard scanning 110, which in the particular embodiment shown can include 8 or 16 samples. A sample can include an elementary signal conversion event, and can reflect demodulation and/or integration results for one or more full input signal periods. Such processing can further include a common-mode filtering of values sensed on multiple electrodes. Such values can then be subject to baseline and difference calculations, which can determine and differentiate between current sense values and baseline values. A sufficiently large difference can indicate a touch event.

In the case of a "Noise" indication, processing can proceed according to local noise processing path 106. Local noise processing 106 can include noise reduction techniques, such as frequency hopping 114. A frequency hopping algorithm may be used to switch or "hop" the operating frequency of the capacitance sensing system to a different frequency, where there is less of a chance of noise being present. In one embodiment, there is a single set of calibration data that is used for each of the different frequencies. The calibration data maintains a constant integration time for one half-period for each of the frequencies. This eliminates the need to store different calibration data for each frequency. In one embodiment, upon hopping to a different frequency, listening operation 102 may monitor sense network 108 to determine if noise is present at the new frequency. This may be done, for example by a special listener scan (e.g., without TX data), or be based on analyzing scanned data from sense network 108 acquired during a regular scan. The processing path 106 can further include CMF filtering and/or non-CMF filtering that can filter for external noise events affecting a local set of electrodes. In the particular embodiment shown, non-CMF filtering 116 can include non-linear filtering. In addition, CMF filtering (as described for 112) may be performed in the processing path 106 to compensate for noise attributable, for example, to an LCD panel. Resulting filtered sense values can then be subject to baseline and difference calculations, like that described for the no local noise processing path 104.

Processing paths 104 and 106 show how sense signals derived from sense network 108 can be acquired and filtered. The no local noise processing path 104 can acquire sense values from a sense network 108 with a standard scan 110 and non-local noise filtering 112. A standard scan 110 can sample electrode values to generate sense values using a set number of sample operations and/or a set duration (i.e., integration time). Non-local filtering 112 can provide filtering that is not directed at local noise events, such as those arising from external noise (e.g., from an LCD panel). In particular embodiments, non-local filtering 112 can include common mode type filtering that filters for noise common to all sense electrodes.

The local noise processing path 106 can address the adverse affects of local noise, like that arising from external noise. The local noise processing path 106 can acquire sense values from a sense network 108 and use frequency hopping 114 and/or local noise filtering 116 to reduce the noise. In one embodiment, local noise processing path 106 can use a shorter integration period than the standard scan 110. In addition, local noise filtering 116 can provide filtering to remove local noise events, such as those arising from external noise. In this way, in response to the detection of noise, a processing of capacitance sense signals can switch from a standard scan time and non-local filtering to different frequency using local filtering.

Operation 100 can also include touch-position calculations 120. Such actions can derive positions of touch events from sense values generated by processing paths 104 and 106. Touch position values generated by calculations 120 can be provided to a device application, or the like.

Figure 2:
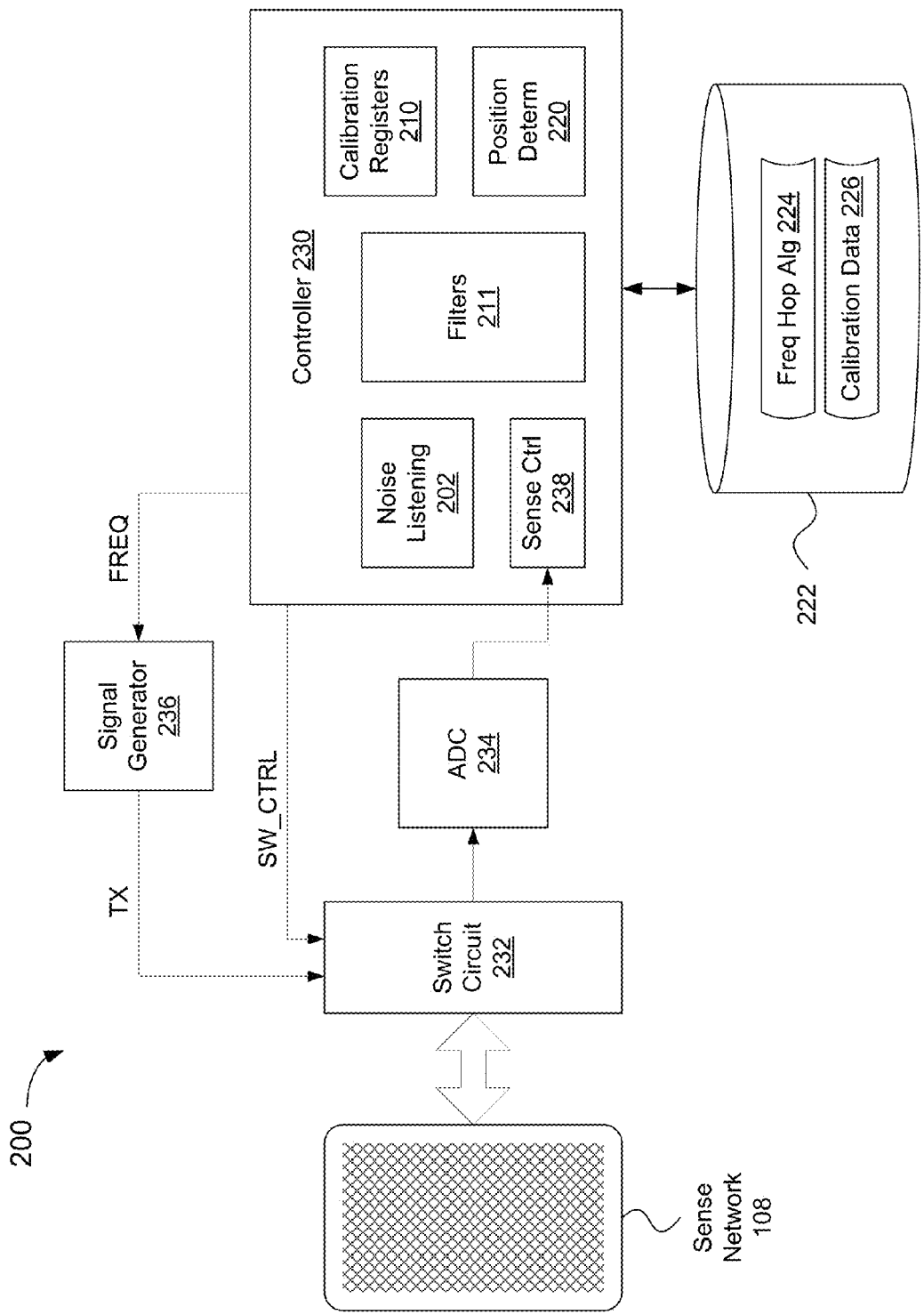
FIG. 2 is a block diagram illustrating a capacitance sensing system, according to an embodiment.

FIG. 2 is a block diagram illustrating a capacitance sensing system 200, according to an embodiment of the present invention. The system 200 can include sense network 108, switch circuit 232, analog-to-digital converter (ADC) 234, signal generator 236, and controller 230. Sense network 108 can be any suitable capacitance sense network, including a mutual capacitance sensing network, as disclosed herein. Sense network 108 can include multiple sensors (e.g., electrodes) for sensing changes in capacitance.

Switch circuits 232 can selectively enable signal paths, both input and output signal paths, between sense network 108 and controller 230. In the embodiment shown, switch circuit 232 can also enable a signal path between signal generator 236 and sense network 108.

ADC 234 can convert analog signals received from sense network 108 via switching circuits 232 into digital values. ADC 234 can be any suitable ADC, including but not limited to a successive approximation (SAR) ADC, integrating ADC, sigma-delta modulating ADC, and a "flash" (voltage ladder type) ADC, for example.

Signal generator 236 can generate a signal for inducing sense signals from sense network 108. For example, signal generator 236 can be a periodic transmit (TX) signal applied to one or more transmit electrodes in a mutual capacitance type sense network 108. A TX signal can induce a response on corresponding RX electrodes, which can be sensed to determine whether a touch event has occurred.

Controller 230 can control capacitance sensing operations in the system 200. In one embodiment, controller 230 can include sense control circuits 238, filter circuits 211, position determination circuit 220, noise listening circuits 202 and calibration registers 210. In some embodiments, controller 230 (e.g., circuits 238, 211, 220, 202 and 210) can be implemented by a processor executing instructions. However, in other embodiments, all or a portion of such circuits can be implemented by custom logic and/or programmable logic.

Sense control circuit 238 can generate signals for controlling acquisition of signals from sense network 108. In the embodiment shown, sense control circuit 238 can activate switch control signals SW_CTRL applied to switching circuit 232. In a particular embodiment, mutual capacitance sensing can be employed, and sense control circuit 238 can sequentially connect a TX signal from signal generator 336 to TX electrodes within sense network 108. As each TX electrode is driven with the TX signal, sense control circuit 238 can sequentially connect RX electrodes to ADC 234 to generate digital sense values for each RX electrode. It should be understood that other embodiments can use different sensing operations.

Noise listening circuit 202 can also control acquisition of signals from sense network 108 by activating switch control signals SW_CTRL. However, noise listening circuit 202 can configure paths to sense network 108 to enable the detection of local noise, as opposed to touch events. In a particular embodiment, noise listening circuit 202 can isolate signal generator 236 from sense network 108. In addition, multiple groups of electrodes (e.g., RX, TX or both) can be simultaneously connected to ADC 234. Noise listening circuit 202 can filter such digital values and then compare them to noise thresholds to determine a noise level. Such actions can include arriving at "No Noise", "Noise" and optionally "High Noise" determinations as described above with respect to FIG. 1.

If there is no noise determination from noise listen circuit 202, controller 203 can perform a standard scan 110, as described above. In response to a noise determination from noise listening circuit 202, controller 230 can alter capacitance sensing operations. In one embodiment, if noise is detected, sense control circuit 238 can implement a frequency hopping scheme (such as frequency hopping 114 of FIG. 1) according to a frequency hopping algorithm 224. Sense control circuit 238 can provide a signal FREQ to signal generator 236, causing signal generator 236 to switch the frequency of the signal TX according to the scheme defined by frequency hopping algorithm 224. In one embodiment, the internal settings for frequency hopping are controlled by the values in calibration registers 210. In one embodiment, a single set of calibration data 226 is used for each frequency used by the frequency hopping algorithm 224. The calibration data 224 may include, for example, internal settings for each frequency, such as the integration time (e.g., the amount of time during with sensed current is averaged to get total charge), and IDAC data that is applied to each crossing of TX and RX electrodes in sense network 108 to compensate for parasitic mutual capacitance. The frequency hopping algorithm 224 and calibration data 226 may be stored on a storage device 222 accessible to controller 230.

Filter circuits 211 can filter sense values generated during sense operations and noise detection operations. In the embodiment shown, filter circuits 211 can enable one or more types of median filtering and one or more types of common mode filtering. It is understood that filter circuits 211 can be digital circuits operating on digital values representing sensed capacitance. In a particular embodiment, filter circuits 211 can include a processor creating sense value data arrays from values output from ADC 234. These arrays of sense values can be manipulated according to one or more selected filtering algorithm to create an output array of filtered sense values. A type of filtering employed by filter circuits 211 can be selected based on detected noise levels.

Position determination circuit 220 can take filtered sense values to generate touch position values (or no detected touches) for use by other processes, such as applications run by a device. In this way, a capacitance sensing system 200 can include listening circuits for detecting noise values and digital filters, selectable based on a detected noise level.

The idea of frequency hopping is to detect the noise which exceeds some threshold and switch to different frequency which has the noise below threshold. If there is no one frequency in a list which meets the noise threshold, then the frequency hopping algorithm may pick the most quiet frequency and operate at that frequency. The system may listen to the noise and turn on filtering in case of exceeding some other acceptable noise threshold. The combination of noise listening and filtering with frequency hoping can use three different thresholds: 1) a first noise threshold where the noise may be filtered with filters; 2) a second noise threshold where the noise cannot definitively be filtered by standard filters and may benefit from a frequency change; and 3) a third noise threshold where the noise is considered excessive noise and where additional steps may be taken, such as decreasing the integration time.

Figure 3:
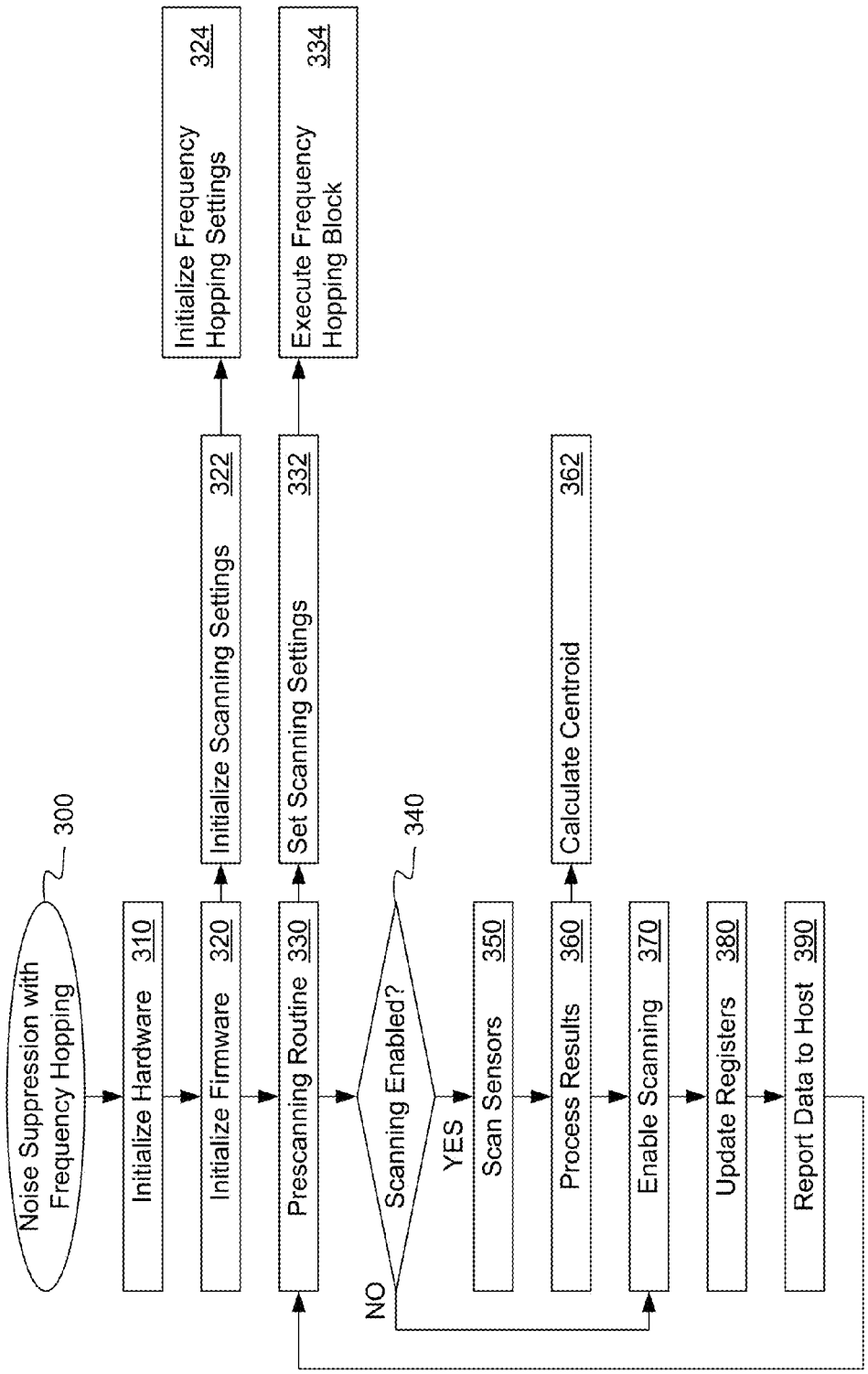
FIG. 3 is a flow chart illustrating a method of noise suppression with frequency hoping, according to one embodiment.

FIG. 3 is a flow chart illustrating a method of noise suppression with frequency hoping, according to one embodiment of the present invention. The method 300 may be performed by processing logic that may comprise hardware (circuitry, dedicated logic, etc.), software (such as is run on a general purpose computing system or a dedicated machine), firmware (embedded software), or any combination thereof. In one embodiment, the controller 230, described above with respect to FIG. 2, performs some of the operations of method 300. Alternatively, other components of the capacitance sensing system 200 can perform some or all of the operations of method 300.

Referring to FIG. 3, the method 300 begins with initializing hardware (block 310) and initializing firmware (block 320). Initializing the hardware may include setting up the circuitry used to scan the electrodes of the sense network, such as the switching circuits 232, ADC 234, signal generator 236, etc. As part of initializing the firmware, the processing logic can assign global variables, initialize scanning settings (block 322) and initialize frequency hopping settings (block 324). Initializing the scanning settings at block 322 may include, for example, setting the number of scanning cycles (e.g., number of samples) to be performed, setting the integration time for the given frequency, which electrodes are to be scanned, a scan order, initialize any variables and thresholds associated with scanning, or the like. Initializing the frequency hopping settings at block 324 may include, for example, setting the available number of frequencies, variables and thresholds associated with the frequency hoping algorithm 224, or the like. Next, the processing logic performs a pre-scan routine (block 330) in which the processing logic sets the scanning settings (block 332), and executes the frequency hopping algorithm (block 334). Also, as part of the pre-scanning routine, the processing logic can scan the electrodes to obtain baselines levels for the electrodes. The baselines are measured when there is no touch on the device and are used to determine whether a change from the baseline (raw data) is above a touch threshold. The pre-scan routine may include other systems operations as would be appreciated by one of ordinary skill in the art having the benefit of this disclosure.

Next, the processing logic determines if the scanning is enabled (block 340). If not, the processing logic enables the scanning (block 370), updates the registers (block 380), and reports data to a host (block 390), returning to the pre-scan routine at block 330. In one embodiment, updating the registers at block 380 includes loading the values from the single set of calibration data 226 into calibration registers 210. Since the same calibration data 226 is used for each frequency, updating the registers at block 380 may only be done once, in certain embodiments. In one embodiment, when reporting data to the host at block 390, the processing logic sends an interrupt to the host to let a driver of the operating system of the host know that there is new data.

When the scanning is enabled at block 340, the processing logic scans the sensors (block 350) and processes the results (block 360). As part of processing the results, the processing logic can determine a difference between the raw counts and the baseline. The raw counts may be a digital value that represents the capacitance measured on the electrodes. Also, as part of processing the results, the processing logic calculates the centroid (block 362). The centroid may determine a coordinate location of the touch, such as the X/Y coordinates of the touch. This may be reported in terms of pixels, or in terms of a coordinate system mapping of the touch surface. The processing logic may also perform filtering when certain conditions apply, as described herein.

The flow chart of FIG. 3 shows how the frequency hopping algorithm can be implemented in the architecture of a capacitive touch screen controller. In one embodiment, the capacitive touch screen controller is the TrueTouch® capacitive touchscreen controller, such as the CY8CTMA3xx family of TrueTouch® Multi-Touch All-Points touchscreen controllers, developed by Cypress Semiconductor Corporation of San Jose, Calif. The TrueTouch® capacitive touchscreen controller uses sensing technology to resolve touch locations of multiple fingers and a stylus on touchscreens up to 5 inches, supports leading operating systems, and is optimized for low-power multi-touch gesture and all-point touchscreen functionality. Alternatively, the frequency hopping features may be implanted in other touchscreen controllers, or other touch controllers of touch sensing devices.

Figure 4:
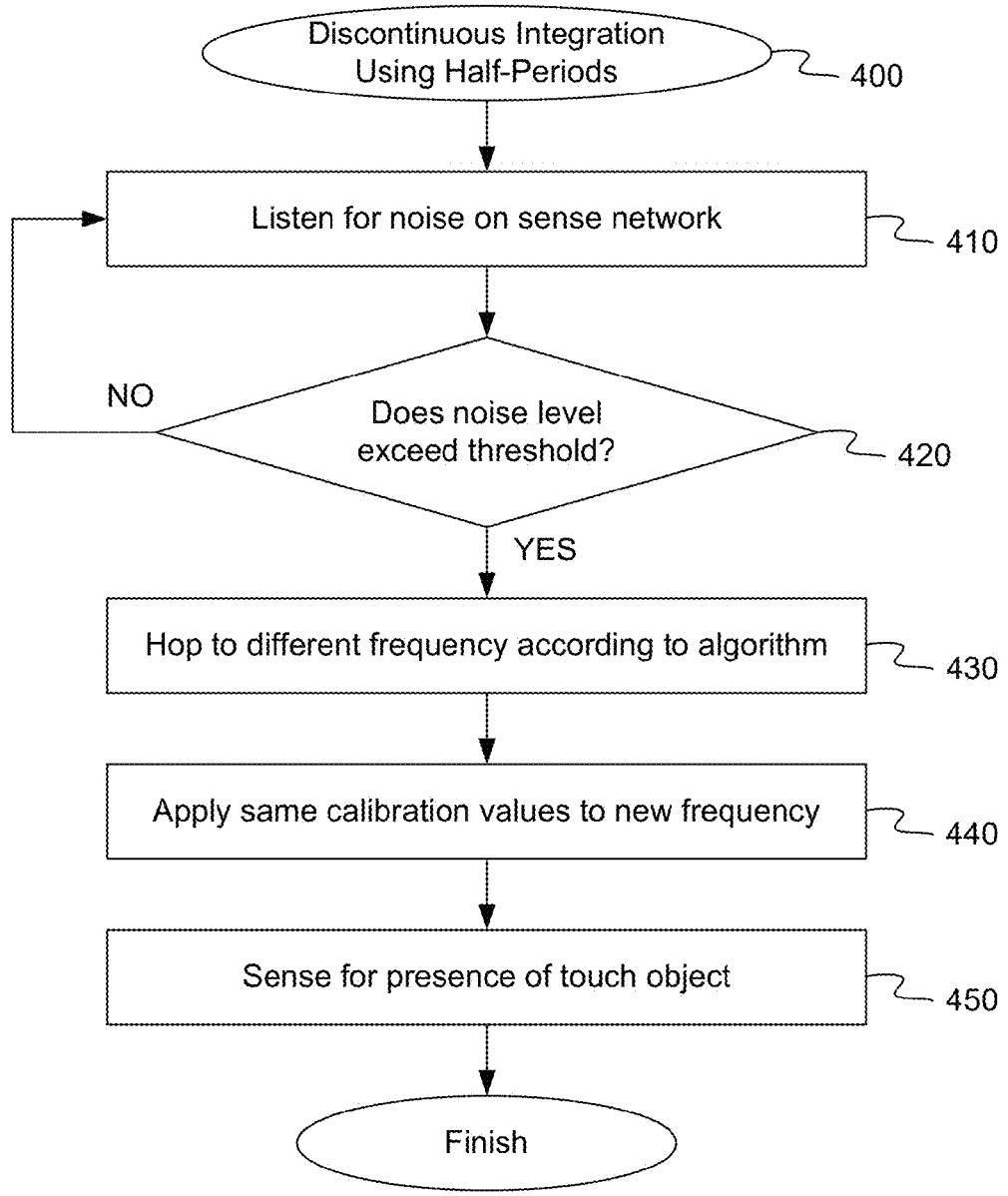
FIG. 4 is a flow chart illustrating a method of discontinuous integration using half periods, according to one embodiment.

FIG. 4 is a flow chart illustrating a method of discontinuous integration using half periods, according to one embodiment of the present invention. The method 400 may be performed by processing logic that may comprise hardware (circuitry, dedicated logic, etc.), software (such as is run on a general purpose computing system or a dedicated machine), firmware (embedded software), or any combination thereof. In one embodiment, the controller 230, described above with respect to FIG. 2, performs some of the operations of method 400. Alternatively, other components of the capacitance sensing system 200 can perform some or all of the operations of method 400.

Referring to FIG. 4, the method 400 begins with listening for noise on the sense network (block 410). In one embodiment, noise listening circuit 202 monitors the signals on the RX electrodes of sense network 108 for noise. Noise listening circuit 202 may use the same electrodes used for capacitance sensing (e.g., touch-position detection) for noise detection. Noise listening circuit 202 may compare detected noise to one or more threshold values (block 420) to make a determination on the presence of noise. If the noise is below a first threshold, no noise is determined to be present. In this case, method 400 may continue with normal operation or return to block 410 to continue monitoring for noise at the current frequency. If the noise is above the first threshold, noise is determined to be present, and method 400 may continue to block 430, where steps may be taken to decrease the effect of the noise on capacitance sensing operations.

In one embodiment, sense control circuit 238 may cause the capacitance sensing system 200 to hop to a different frequency (block 430), according to a frequency hopping algorithm 224. Frequency hopping algorithm may include a number of different frequencies, arranged in a specified order, which may be used as the operating frequency for capacitance sensing system 200. The idea of frequency hopping is to switch to a different frequency which has no noise or a lower level of noise to lessen the adverse effects on capacitance sensing. Thus, upon determining at block 420 that the noise level exceeds a predefined threshold, the operating frequency may be switched to the next frequency specified by the frequency hopping algorithm at block 430. In one embodiment, upon hopping to a new frequency at block 430, sense control circuit 238 may measure the noise level at the new frequency. If the noise threshold is exceeded, the operating frequency may be switched again until a frequency with an acceptable level of noise is located.

Next, or optionally prior to switching to the new frequency, sense control circuit 238 may apply the same calibration values to the new frequency (block 440). In one embodiment, applying the calibration values includes loading calibration data 226 into calibration registers 210. The calibration data may include, for example, internal settings for the new frequency, such as the integration time (e.g., the amount of time during with sensed current is averaged to get total charge), and IDAC data that is applied to each crossing of TX and RX electrodes in sense network 108 to compensate for parasitic mutual capacitance. In one embodiment, there is only a single set of calibration data 226 that is shared by all frequencies used in the frequency hopping algorithm 224. This eliminates the need to store different calibration data for each frequency, thereby saving space in storage device 222.

Sense control circuitry 238 can then scan sense network 108 for the presence of a touch object (e.g., a stylus or a user's finger) at the calibrated new frequency (block 450). In one embodiment, this includes integrating the currents received from sense network 108 for a period of time (i.e., the integration time) in order to get the total charge. Since each frequency shares the same calibration data, the integration time is kept constant for one half-period across all frequencies used by the frequency hopping algorithm 224. Discontinuous integration (by half-period shortening) is acceptable for use in capacitance sensing systems without suffering from performance integration. The channel frequency response of discontinuous integration (by half-period shortening) does not have bifurcation of harmonics or significant differences from continuous integration. Thus, discontinuous integration, using a constant integration time, for each scanning frequency eliminates the need to store calibration data for each frequency used by the frequency hopping algorithm 224.

Figure 5A:
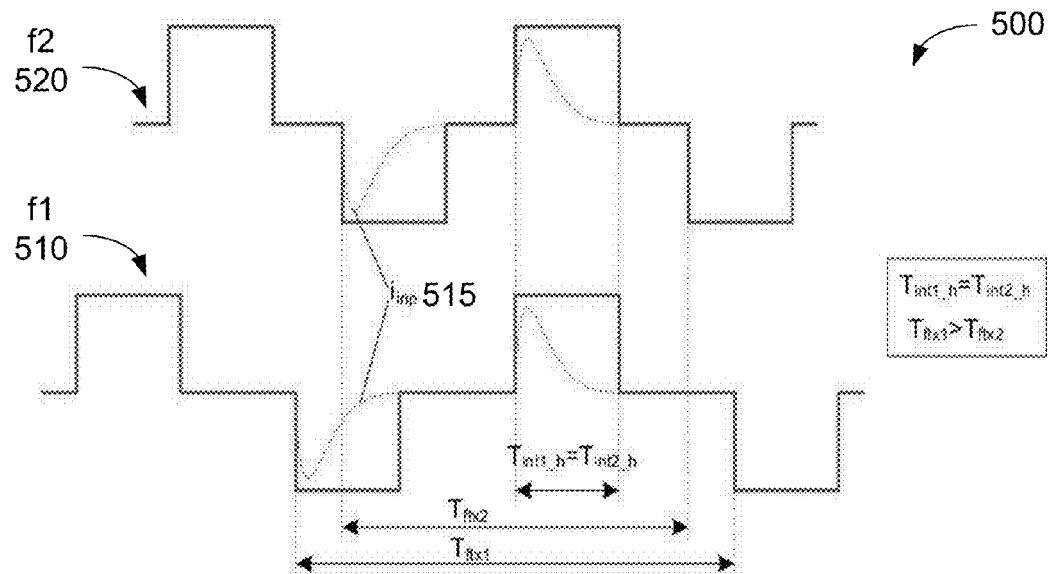
FIG. 5A is a timing diagram illustrating the operation of a capacitance sensing system with a constant integration time, according to an embodiment.

FIG. 5A is a timing diagram illustrating the operation of a capacitance sensing system with a constant integration time, according to an embodiment of the present invention. The diagram 500 illustrates two frequencies: f1 510 and f2 520. In one embodiment f1 510 may represent the initial or current operating frequency of capacitance sensing system 200 and f2 520 may represent the frequency that is hopped to, according to frequency hopping algorithm 224. As illustrated, the frequencies have different periods (i.e., $T_{ftx1} > T_{ftx2}$), but the integration time is constant for both f1 510 and f2 f20 (i.e., $T_{int1\_h} = T_{int2\_h}$). For example, the integration time may be equal to 2 microseconds, or to some other time value.

The diagram 500 shows that the input current $I_{inp}$ 515 is the same at both frequencies f1 510 and f2 520. In one embodiment, the input current $I_{inp}$ 515 is the current received from one or more RX electrodes of sense network 108. While the integration time remains the same for both frequencies, the lengths of the pauses between integrations differ to account for the differences in period length. These pauses are part of the discontinuous integration used in some embodiments. For example, if a single ADC 234 is used for 8 RX channels on sense network 108, time is spent accumulating data from each channel. These operations may be performed during the pauses. Generally, when using discontinuous integration the main harmonics and the main lobe of the frequency response characteristics are divided by two. This can create problems with the operation of a frequency hopping algorithm. However, since the same integration time is used for one half-period, the main lobe of the frequency response characteristic is not divided by two. Thus, the system can receive the advantages of continuous integration without having to store separate calibration data for each frequency.

Figure 5B:
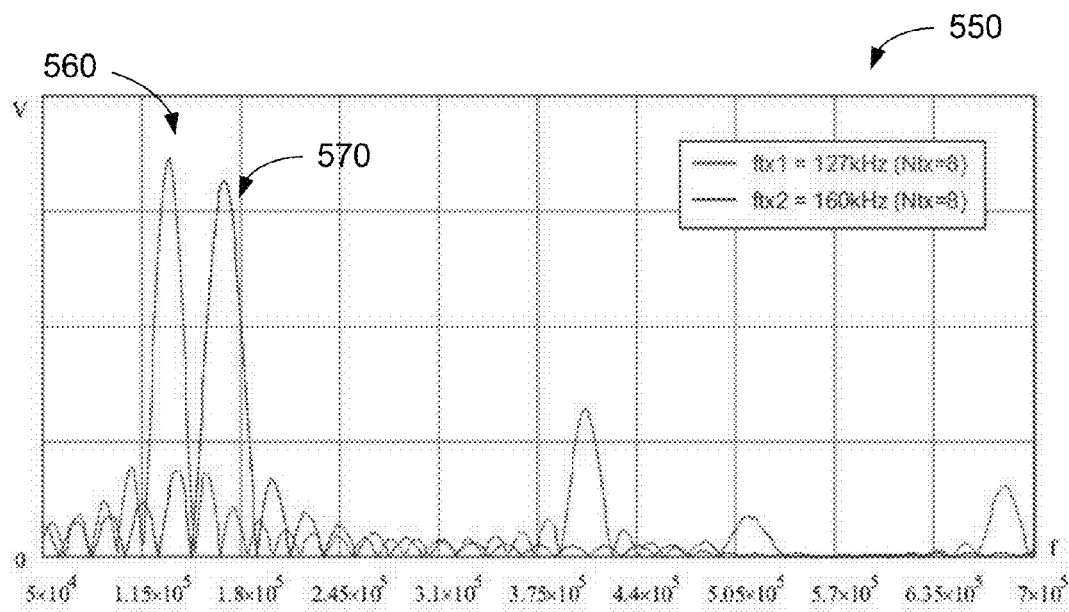
FIG. 5B is a diagram illustrating the frequency response characteristics for a capacitance sensing system using discontinuous integration (by half-period shortening), according to an embodiment.

FIG. 5B is a diagram illustrating the frequency response characteristics for a capacitance sensing system using discontinuous integration (by half-period shortening), according to an embodiment of the present invention. In this embodiment, the illustrated frequency response characteristics correspond to the frequencies f1 510 and f2 520, described above with respect to FIG. 5A. As illustrated in the diagram 550, the main lobes 560 and 570 of each frequency response characteristic are shifted (i.e., offset at different frequencies), however, the area of all lobes remain substantially the same. That is, the area is not changed with frequency, as might be the case with integration time changing, and the same signals can be detected using different operating frequencies.

Figure 6:
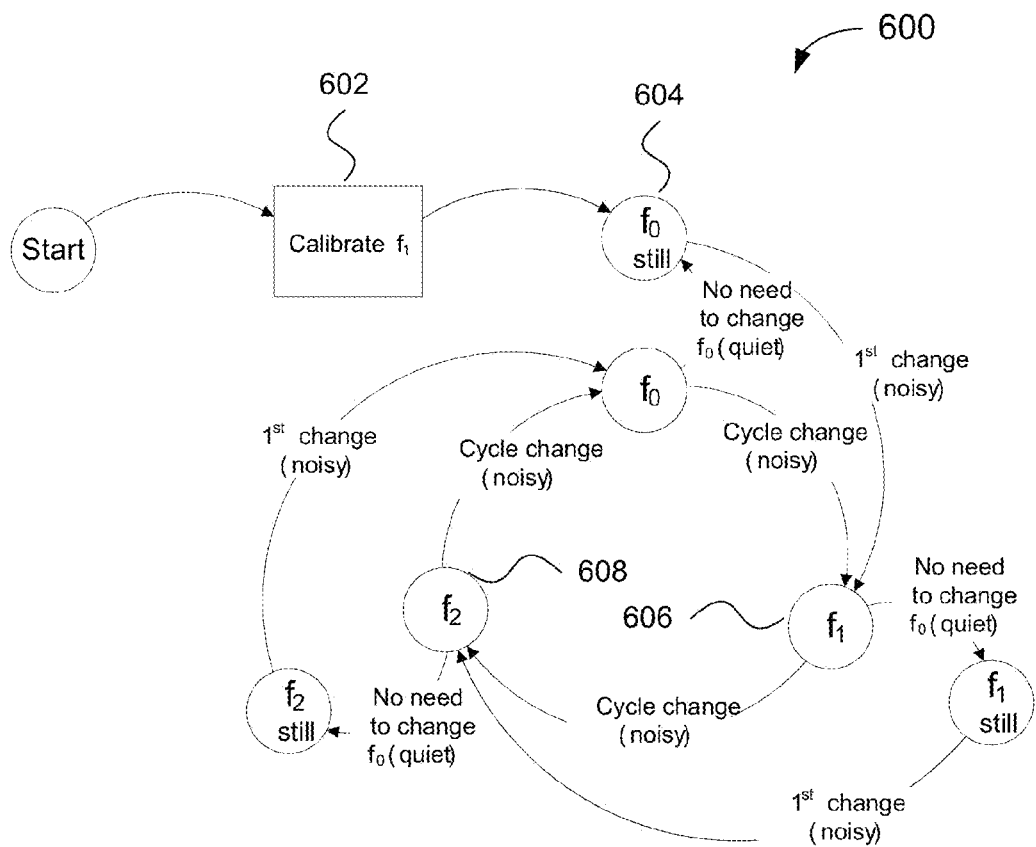
FIG. 6 is a flow diagram illustrating a frequency hopping algorithm using shared calibration data, according to an embodiment.

FIG. 6 is a flow diagram illustrating a frequency hopping algorithm using shared calibration data, according to an embodiment of the present invention. The algorithm 600 starts with calibrating capacitance sensing system 200 for a frequency f1 (step 602). Since each frequency used by the algorithm 600 shares a single set of calibration data, only one calibration operation (step 602) is performed. In other systems, each frequency may have separate calibration data, thus necessitating a calibration operation for each frequency. Depending on the number of frequencies used by the algorithm, this can be a time consuming and resource intensive (e.g., RAM/ROM storage space) process.

Following calibration, the current frequency f0 is monitored for noise (step 604). If no noise is detected, there is no need to change the frequency, so the capacitance sensing system continues operation at frequency f0. If noise is detected, the algorithm 600 initiates a switch to the next frequency f1 specified by the algorithm 600 (step 606). Since frequency f1 was already calibrated at step 602, no additional calibration operation is needed. The frequency f1 is monitored for noise, and if noise is detected, the algorithm 600 initiates a switch to another frequency f2 (step 608). Since the frequency f2 shares the same calibration data with the frequency f1, no further calibration is needed. The calibration may be performed only once, upon system initialization, and upon the switch from f1 to f2, the system need only apply the same calibration values. The system continues operation at frequency f2, maintaining a constant integration time. The algorithm 600 continues to cycle through the available frequencies as needed due to the detection of noise.

Figure 7:
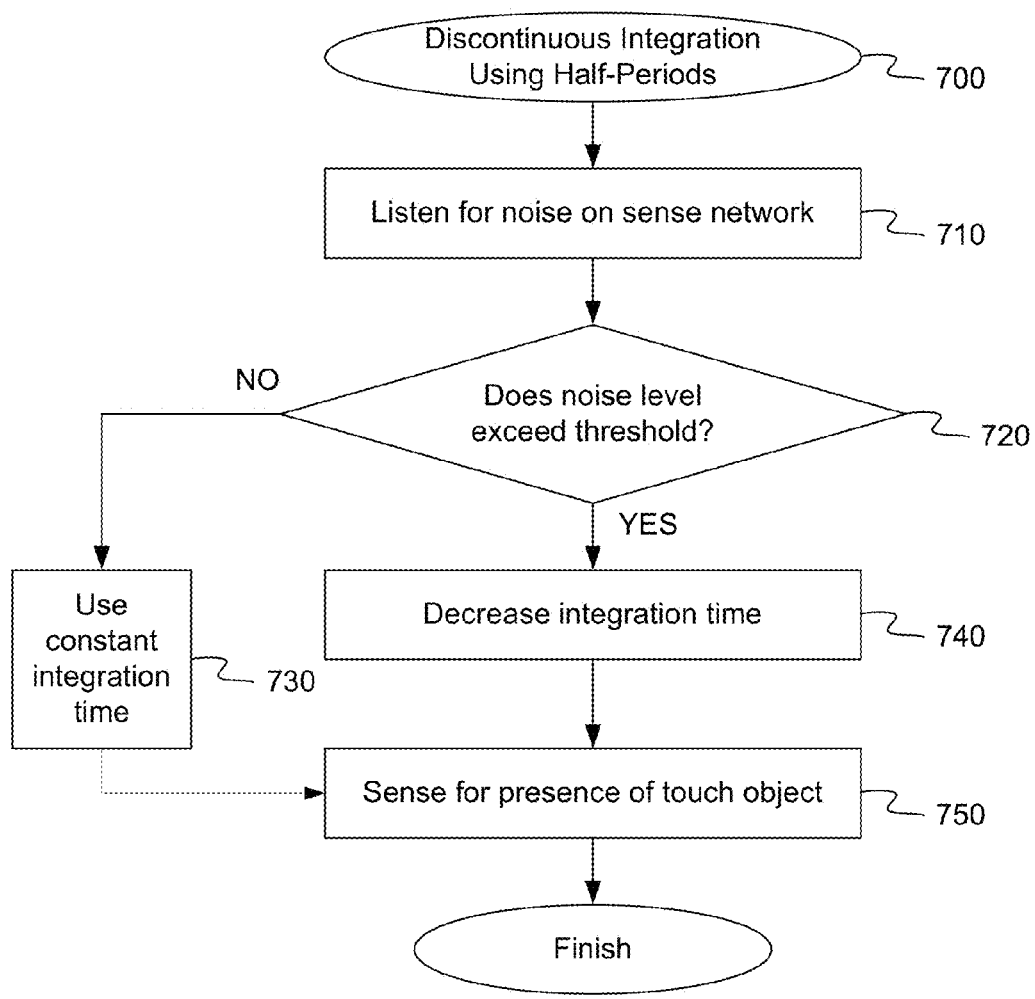
FIG. 7 is a flow chart illustrating a method of discontinuous integration using half periods, according to one embodiment.

FIG. 7 is a flow chart illustrating a method of discontinuous integration using half periods, according to one embodiment of the present invention. The method 400 may be performed by processing logic that may comprise hardware (circuitry, dedicated logic, etc.), software (such as is run on a general purpose computing system or a dedicated machine), firmware (embedded software), or any combination thereof. In one embodiment, the controller 230, described above with respect to FIG. 2, performs some of the operations of method 700. Alternatively, other components of the capacitance sensing system 200 can perform some or all of the operations of method 700.

Referring to FIG. 7 the method 700 begins with listening for noise on the sense network (block 710). In one embodiment, noise listening circuit 202 monitors the signals on the RX electrodes of sense network 108 for noise. Noise listening circuit 202 may use the same electrodes used for capacitance sensing (e.g., touch-position detection) for noise detection. Noise listening circuit 202 may compare detected noise to one or more threshold values (block 720) to make a determination on the presence of noise. In one embodiment, the threshold may be a second threshold used in indicated the presence of "high noise." The second threshold may, for example, be higher than a first threshold used to determine whether any noise is present. If the noise is below the second threshold, the constant integration time shared across all frequencies in the frequency hopping algorithm may be used (block 730). If the noise is above the second threshold, high noise is determined to be present, and method 400 may continue to block 740, where steps may be taken to decrease the effect of the noise on capacitance sensing operations.

In one embodiment, the capacitance sensing system may decrease the integration time, while maintaining a constant frequency (block 740). This may be done, for example, by uploading new calibration data to calibration registers 210, specifying the new integration time. This may reduce the amplitude of the noise on the main frequency harmonics. In one embodiment, reducing the integration time may be done to reduce the noise instead of hopping to a different frequency (e.g., if the capacitance sensing system does not support frequency hopping). In another embodiment, it may be done in addition to switching the frequency. In one embodiment, the integration time may be reduced to a specific value that has some special relation between the integration time and the pauses between integrations. By properly picking the pauses times, the frequency response of the capacitance sensing system can be manipulated to reduce noise at specific harmonics where noise is present, leading to an improvement in sensing performance.

In one embodiment, controller 230 includes an integrator, which operates synchronously with ADC 234 at a T/2 rate. The integrator may include a reset switch, which is activated to reset the integrator between integration periods. The reset switch may take some period of time ($T_{res}$) to reset. In one embodiment, this reset switch narrows the integration period ($\tau$) to $\tau = T/2 - T_{res}$. By controlling the reset time $T_{res}$, controller 230 can introduce a notch at a desired location (e.g., to reduce noise at specific harmonics). For example, if $T_{res} = \frac{1}{3} * T/2$, then $\tau = T/3$. This can eliminate the third harmonic of the frequency response. Similarly, if $T_{res} = \frac{1}{5} * T/2$, then $\tau = \frac{2}{5} * T$. This can eliminate the fifth harmonic of the frequency response.

Sense control circuitry 238 can then scan sense network 108 for the presence of a touch object (e.g., a stylus or a user's finger) at the calibrated new frequency (block 750). In one embodiment, this includes integrating the currents received from sense network 108 for a period of time (i.e., the integration time) in order to get the total charge. The integration time can be either the standard integration time or the decreased integration time, based on the determination at block 720.

Figure 8A:
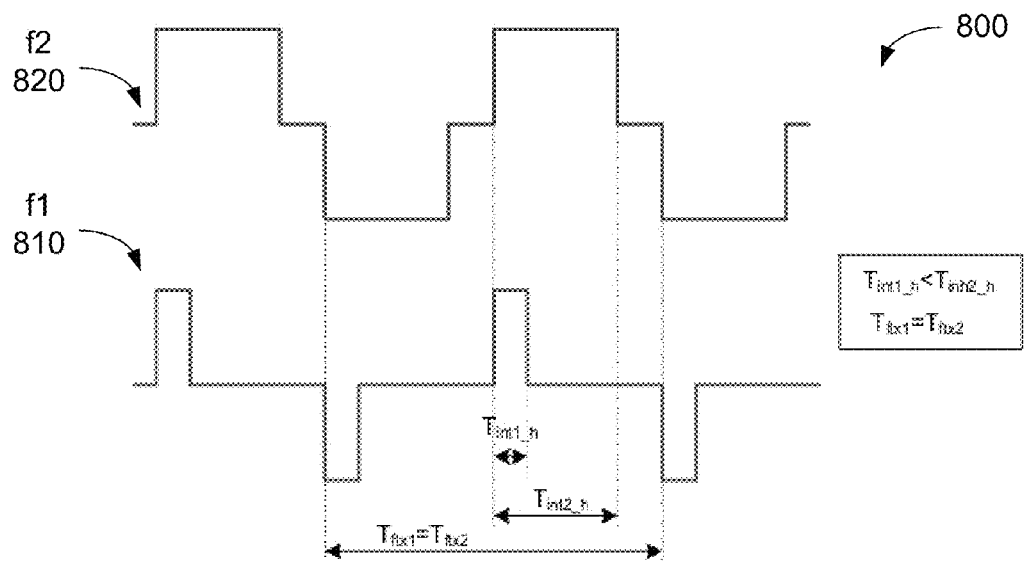
FIG. 8A is a timing diagram illustrating the operation of a capacitance sensing system with a decreased integration time for noise immunity, according to an embodiment.

FIG. 8A is a timing diagram illustrating the operation of a capacitance sensing system with a decreased integration time for noise immunity, according to an embodiment of the present invention. The diagram 800 illustrates two frequencies: f1 810 and f2 820. In one embodiment f2 820 may represent the initial or current operating frequency of capacitance sensing system 200 and f1 810 may represent the same frequency after the integration time is reduced. As illustrated, the frequencies have the same periods (i.e., $T_{fix1} = T_{fix2}$), but the integration time varies for f1 510 and f2 f20 (i.e., $T_{int1\_h} < T_{int2\_h}$). For example, the integration times may be $T_{int1\_h} = 2.5$ microseconds and $T_{int2\_h} = 0.625$ microseconds. In other embodiments, some other integration times may be used.

Figure 8B:
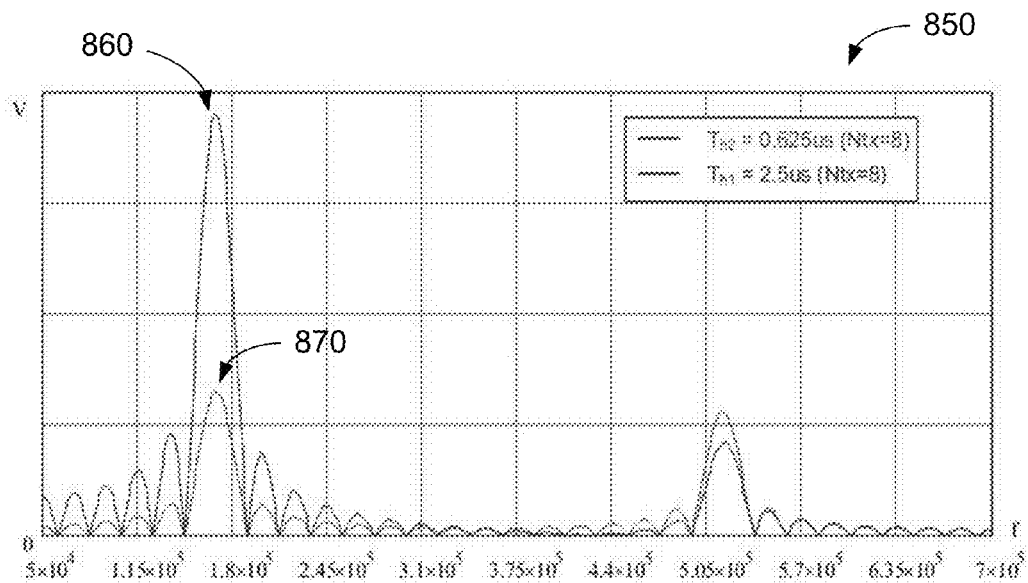
FIG. 8B is a diagram illustrating the frequency response characteristics for a capacitance sensing system with a decreased integration time for noise immunity, according to an embodiment.

FIG. 8B is a diagram illustrating the frequency response characteristics for a capacitance sensing system with a decreased integration time for noise immunity, according to an embodiment of the present invention. In this embodiment, the illustrated frequency response characteristics correspond to the frequencies f1 810 and f2 820, described above with respect to FIG. 8A. As illustrated in the diagram 850, the amplitude 870 of the noise at the main harmonic after a reduction of the integration time is significantly less than the amplitude 860 before the integration is reduced.

Figure 9:
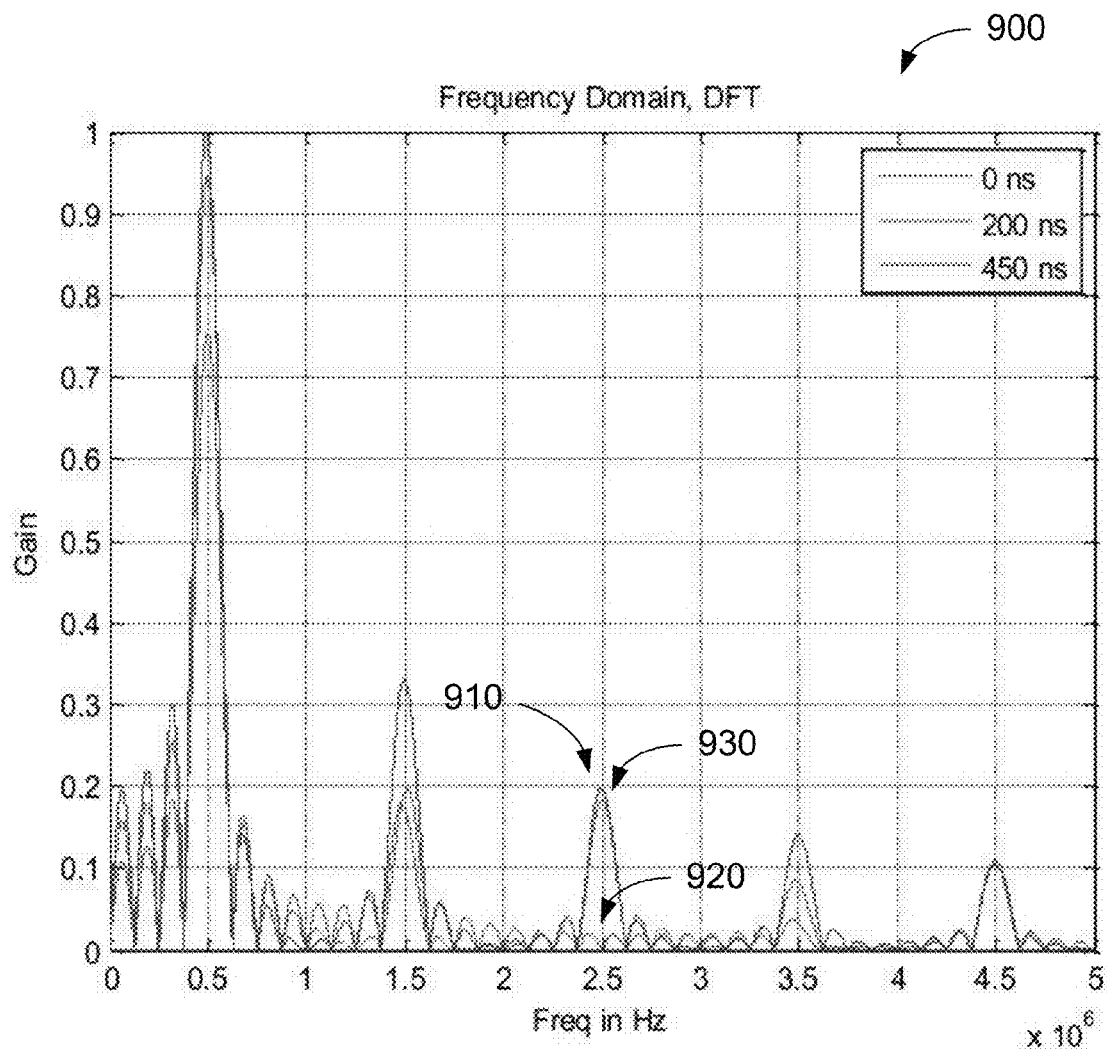
FIG. 9 is a diagram illustrating the frequency response characteristics for a capacitance sensing system with a strategically decreased integration time for noise immunity, according to an embodiment.

FIG. 9 is a diagram illustrating the frequency response characteristics for a capacitance sensing system with a strategically decreased integration time for noise immunity, according to an embodiment of the present invention. In one embodiment, the integration time may be strategically reduced to a specific value that has some special relation between the integration time and the pauses between integrations. By properly picking the pauses times, the frequency response of the capacitance sensing system can be manipulated to reduce noise at specific harmonics where noise is present, leading to an improvement in sensing performance. For example, the diagram 900 shows three different reductions to the integration time: T1=0 nanoseconds (ns), T2=200 ns, and T3=450 ns. Due to the relationship between the pauses and the integration times, noise at specific harmonics may be specifically targeted. The actual relationships may be determined through testing, trial and error, etc., or calculated using appropriate formulas. For example, in the illustrated diagram 900, the various integration times slightly vary the noise amplitude at the first (0.5 MHz) and second harmonics (1.5 MHz), but don't significantly reduce the noise. At the third harmonic (2.5 MHz), however, while there is minimal reduction in noise for T1 910 and T3 930, there is a significant reduction in noise for T3 920. Thus, in this case a reduction of the integration time by 200 nanoseconds provides good noise immunity at the noise frequency of 2.5 MHz. If noise is detected at this frequency, capacitance sensing system can target that noise for immunity by reducing the integration time the specified amount (e.g., 200 nanoseconds). In one embodiment, reducing the integration time may be done to reduce the noise instead of hopping to a different frequency (e.g., if the capacitance sensing system does not support frequency hopping).

Figure 10:
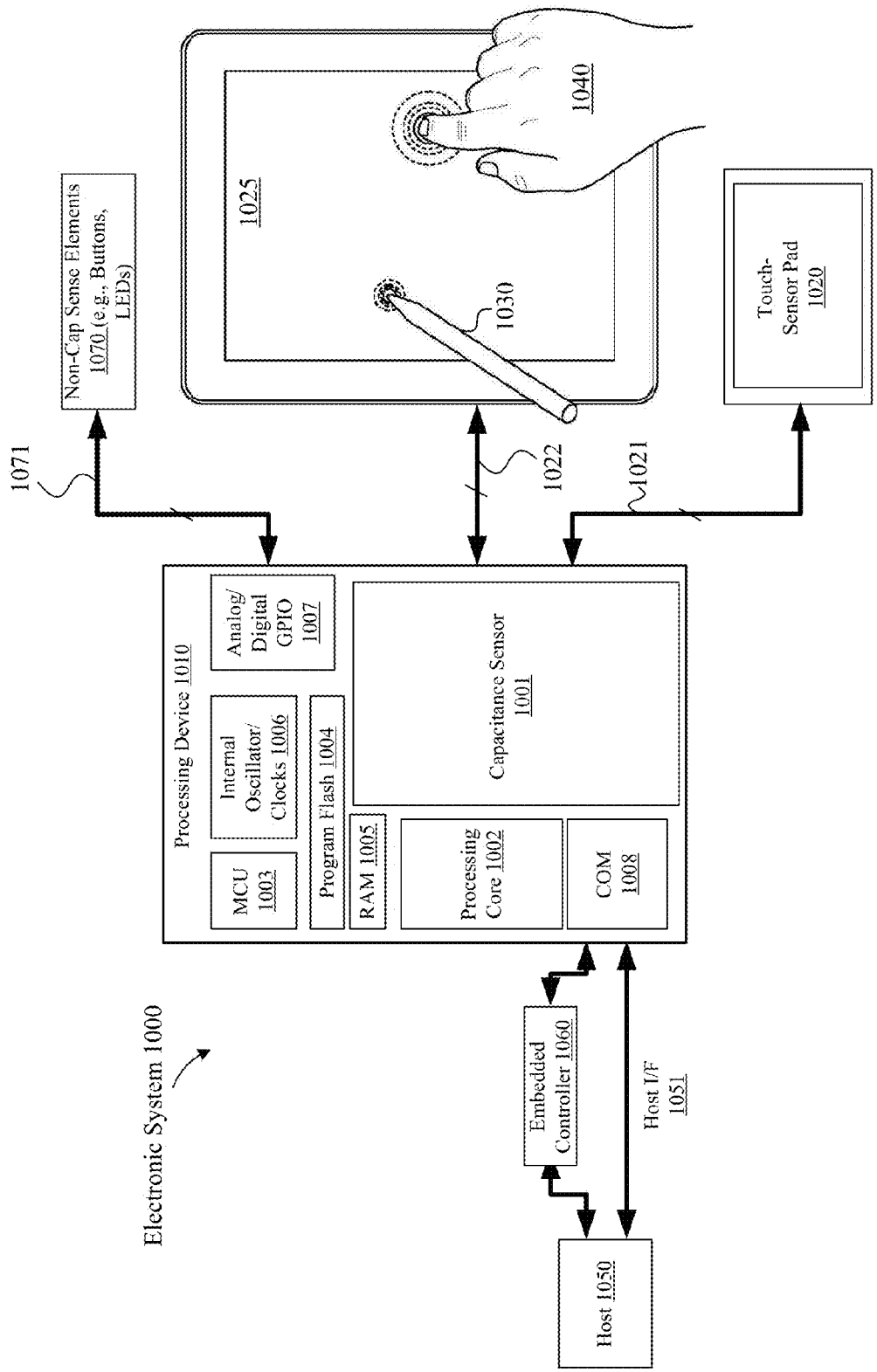
FIG. 10 is a block diagram illustrating one embodiment of an electronic system having a processing device for discontinuous integration using half periods, according to an embodiment.

FIG. 10 is a block diagram illustrating one embodiment of an electronic system 1000 having a processing device 1010 for discontinuous integration using half periods. Electronic system 1000 includes processing device 1010, touch screen 1025, touch sensor pad 1020, stylus 1030, host processor 1050, embedded controller 1060, and non-capacitance sense elements 1070. In the depicted embodiment, the electronic system 1000 includes the touch screen 1025 coupled to the processing device 1010 via bus 1022. Touch screen 1025 may include a multi-dimension capacitive sense array. The multi-dimension sense array may include multiple sense elements, organized as rows and columns. In another embodiment, the touch screen 1025 operates as an all-points-addressable ("APA") mutual capacitance sense array. In another embodiment, the touch screen 1025 operates as a coupled-charge receiver.

The operations and configurations of the processing device 1010 and the touch screen 1025 for detecting and tracking the touch object 1040 and stylus 1030 are described in detail above. In short, the processing device 1010 is configured to detect a presence of the stylus 1030 on the touch screen 1025, as well as a presence of the touch object 1040. The processing device 1010 may detect and track the stylus 1030 and the touch object 1040 individually on the touch screen 1025. In one embodiment, the processing device 1010 can detect and track both the stylus 1030 and touch object 1040 concurrently on the touch screen 1025. As described herein, the touch screen 1025 capacitively couples with the stylus 1030, as opposed to conventional inductive stylus applications. It should also be noted that the same assembly used for the touch screen 1025, which is configured to detect touch objects 1040, is also used to detect and track the stylus 1030 without an additional PCB layer for inductively tracking the stylus 1030 as done conventionally.

In the depicted embodiment, the processing device 1010 includes analog and/or digital general purpose input/output ("GPIO") ports 1007. GPIO ports 1007 may be programmable. GPIO ports 1007 may be coupled to a Programmable Interconnect and Logic ("PIL"), which acts as an interconnect between GPIO ports 1007 and a digital block array of the processing device 1010 (not shown). The digital block array may be configured to implement a variety of digital logic circuits (e.g., DACs, digital filters, or digital control systems) using, in one embodiment, configurable user modules ("UMs"). The digital block array may be coupled to a system bus. Processing device 1010 may also include memory, such as random access memory ("RAM") 1005 and program flash 1004. RAM 1005 may be static RAM ("SRAM"), and program flash 1004 may be a non-volatile storage, which may be used to store firmware (e.g., control algorithms executable by processing core 1002 to implement operations described herein). Processing device 1010 may also include a memory controller unit ("MCU") 1003 coupled to memory and the processing core 1002. In one embodiment, the processing device 1010 is representative of controller 230, described above.

The processing device 1010 may also include an analog block array (not shown). The analog block array is also coupled to the system bus. Analog block array also may be configured to implement a variety of analog circuits (e.g., ADCs or analog filters) using, in one embodiment, configurable UMs. The analog block array may also be coupled to the GPIO ports 1007.

As illustrated, capacitance sensor 1001 may be integrated into processing device 1010. Capacitance sensor 1001 may include analog I/O for coupling to an external component, such as touch sensor pad 1020, touch screen 1025, touch-sensor slider (not shown), touch-sensor buttons (not shown), and/or other devices. In one embodiment, touch sensor pad 1020, touch screen 1025 and non-capacitive sensor elements 1070 may be representative of sense network 108 described above.

In one embodiment, the electronic system 1000 includes a touch sensor pad 1020 coupled to the processing device 1010 via bus 1021. Touch sensor pad 1020 may include a multi-dimension capacitive sense array. The multi-dimension sense array may include multiple sense elements, organized as rows and columns. In another embodiment, the touch sensor pad 1020 is an APA mutual capacitance sense array. In another embodiment, the touch sensor pad 1020 operates as a coupled-charge receiver.

In an embodiment, the electronic system 1000 may also include non-capacitance sense elements 1070 coupled to the processing device 1010 via bus 1071 and GPIO port 1007. The non-capacitance sense elements 1070 may include buttons, light emitting diodes ("LEDs"), and other user interface devices, such as a mouse, a keyboard, or other functional keys that do not require capacitance sensing. In one embodiment, buses 1021, 1022, and 1071 are embodied in a single bus. Alternatively, these buses may be configured into any combination of one or more separate buses.

Processing device 1010 may include internal oscillator/clocks 1006 and communication block ("COM") 1008. In another embodiment, the processing device 1010 includes a spread spectrum clock (not shown). The oscillator/clocks block 1006 provides clock signals to one or more of the components of processing device 1010. Communication block 1008 may be used to communicate with an external component, such as a host processor 1050, via host interface ("I/F") line 1051. Alternatively, processing device 1010 may also be coupled to embedded controller 1060 to communicate with the external components, such as host processor 1050. In one embodiment, the processing device 1010 is configured to communicate with the embedded controller 1060 or the host processor 1050 to send and/or receive data.

Processing device 1010 may reside on a common carrier substrate such as, for example, an integrated circuit ("IC") die substrate, a multi-chip module substrate, or the like. Alternatively, the components of processing device 1010 may be one or more separate integrated circuits and/or discrete components. In one exemplary embodiment, processing device 1010 is the Programmable System on a Chip (PSoC®) processing device, developed by Cypress Semiconductor Corporation, San Jose, Calif. Alternatively, processing device 1010 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 1010 may also be done in the host.

Capacitance sensor 1001 may be integrated into the IC of the processing device 1010, or alternatively, in a separate IC. Alternatively, descriptions of capacitance sensor 1001 may be generated and compiled for incorporation into other integrated circuits. For example, behavioral level code describing capacitance sensor 1001, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 1001.

It should be noted that the components of electronic system 1000 may include all the components described above. Alternatively, electronic system 1000 may include only some of the components described above.

In one embodiment, the electronic system 1000 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, and eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition, and numeric keypad operation.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method comprising:
    monitoring a signal on one or more electrodes of a sense network at a first operating frequency;
    monitoring a signal on the one or more electrodes of the sense network at a second operating frequency;
    identifying a constant integration time for one half-period; and
    using a controller comprising a processing device and a memory to scan the one or more electrodes to detect a conductive object proximate to the sense network, wherein using the controller includes:
        using the constant integration time when scanning the one or more electrodes at the first operating frequency;
        detecting noise in the signal at the first operating frequency;
        switching from the first operating frequency to the second operating frequency in response to detecting the noise; and
        using the constant integration time when scanning the one or more electrodes at the second operating frequency.

2. The method of claim 1, wherein detecting noise in the signal at the first operating frequency comprises:
    comparing a noise level to a first noise threshold; and
    detecting noise if the noise level exceeds the first noise threshold.

3. The method of claim 1, wherein switching from the first operating frequency to the second operating frequency comprises selecting one of a plurality of operating frequencies defined by a frequency hopping algorithm, wherein the second operating frequency is one of the plurality of operating frequencies with a lower noise level.

4. The method of claim 1, wherein the constant integration time is defined in a single set of calibration data used for both the first and second operating frequencies.

5. A capacitance sensing system comprising:
a memory device storing calibration data, including a constant integration time for one-half period; and
a controller coupled to the memory device, wherein the controller is configured to receive signals from a sense network comprising a plurality of electrodes to detect a conductive object proximate to the plurality of electrodes, wherein the controller comprises:
a noise listening circuit configured to monitor the plurality of electrodes during a first mode of operation and during a second mode of operation; and
a sense control circuit configured to scan the plurality of electrodes to detect the conductive object,
wherein the sense network operates at a first operating frequency in the first mode of operation and at a second operating frequency in the second mode of operation, and
wherein the sense control circuit is configured to:
use the constant integration time when scanning the plurality of electrodes at the first operating frequency;
switch from the first operating frequency to the second operating frequency in response to the noise listening circuit detecting noise from at least one noise source at the first operating frequency; and
use the constant integration time when scanning the capacitance sense array at the second operating frequency.

6. The capacitance sensing system of claim 5, wherein to detect the noise from at least one noise source, the noise listening circuit is configured to:
compare a noise level to a first noise threshold; and
detect noise if the noise level exceeds the first noise threshold.

7. The capacitance sensing system of claim 5, wherein to switch from the first operating frequency to the second operating frequency, the sense control circuit is configured to select one of a plurality of operating frequencies defined by a frequency hopping algorithm, wherein the second operating frequency is one of the plurality of operating frequencies with a lower noise level.

8. A host device comprising:
a display;
a capacitance sensing array disposed in connection with the display;
a touchscreen controller coupled to the capacitance sensing array; and
a memory accessible to the touchscreen controller, the memory storing calibration data including a constant integration time for one half-period,
wherein the touchscreen controller comprises:
a capacitance sensing circuit coupled to the capacitance sensing array; and
a noise listening circuit coupled to the capacitance sensing array, wherein
the noise listening circuit is configured to detect noise on the capacitance sensing circuit from at least one noise source at a first operating frequency, wherein the touchscreen controller uses the constant integration time when scanning the capacitance sense array at the first operating frequency, wherein the touchscreen controller is configured to switch from the first operating frequency to a second operating frequency in response to detecting the noise, and wherein the touchscreen controller uses the constant integration time when scanning the capacitance sense array at the second operating frequency.

9. The host device of claim 8, wherein to detect noise on the capacitance sensing array, the noise listening circuit is configured to:
compare a noise level to a first noise threshold; and
detect noise if the noise level exceeds the first noise threshold.

10. The host device of claim 8, wherein to switch to the second operating frequency, the controller is configured to select one of a plurality of operating frequencies defined by a frequency hopping algorithm, wherein the second operating frequency is one of the plurality of operating frequencies with a lower noise level.

11. The host device of claim 8, wherein the constant integration time is defined in a single set of calibration data used for both the first and second operating frequencies.

\* \* \* \* \*